United States Patent [19]
Li et al.

[11] Patent Number: 5,678,226
[45] Date of Patent: Oct. 14, 1997

[54] UNBALANCED FET MIXER

[75] Inventors: Xiaohui Li, San Jose; Michael Wendell Vice, El Granada, both of Calif.

[73] Assignee: Watkins Johnson Company, Palo Alto, Calif.

[21] Appl. No.: 333,775

[22] Filed: Nov. 3, 1994

[51] Int. Cl.$^6$ ..................................................... H04B 1/28
[52] U.S. Cl. ........................... 455/333; 455/318; 455/325
[58] Field of Search .................................... 455/317, 318, 455/319, 323, 325, 327, 333; 327/113, 355, 356

[56] References Cited

U.S. PATENT DOCUMENTS

| | | | |
|---|---|---|---|
| 5,263,198 | 11/1993 | Geddes et al. | 455/333 |
| 5,379,458 | 1/1995 | Vaisanen | 455/319 |
| 5,465,419 | 11/1995 | Zimmerman | 455/333 |

*Primary Examiner*—Reinhard J. Eisenzopf
*Assistant Examiner*—Thanh Le
*Attorney, Agent, or Firm*—Flehr Hohbach Test Albritton & Herbert LLP

[57] ABSTRACT

A unbalanced mixer capable of operation in the absence of DC bias is disclosed herein. The mixer includes an input or local oscillator (LO) port for receiving an input signal. A first transistor has a control terminal coupled to the mixer input port, and an output terminal coupled to a first signal port of the mixer. The mixer further includes a resonator circuit, connected between the transistor control and output terminals, for providing signal isolation between the mixer input port and the first signal port. In a preferred implementation the resonator circuit comprises an inductive element in parallel with a first intrinsic capacitance of the transistor. The mixer may also include a diplexer circuit for coupling signal energy of a first frequency between the output terminal and the first signal port, and for coupling signal energy of a second frequency between the output terminal and a second signal port. A series resonant circuit, connected between the input or LO port and the transistor control terminal, may also be provided for amplifying the input signal. In a preferred implementation the series resonant circuit comprises an input inductive element and an input intrinsic capacitance of the first transistor.

7 Claims, 4 Drawing Sheets

UNBALANCED FET MIXER

BACKGROUND OF THE INVENTION

1. Field of the Invention

This invention relates generally to radio frequency mixers, and more particularly to mixers requiring reduced local oscillator drive levels and having high third order

2. Description of the Prior Art

The dynamic range of many prior an microwave front-ends is controlled by the single and two-tone intermodulation levels of the mixers therein. Typical high-performance mixers obtain third order intercept points approximately equal to the local oscillator (LO) power minus the conversion loss plus 10-dB. Trade-offs between LO power levels and third order intercept and one dB compression points are inevitable, even in complex multiple device schemes attempting to improve isolation, bandwidth, and single-tone intermodulation levels.

When the channel of a field-effect transistor (FET) comprises the mixing element, low-distortion mixing has been shown to be possible even at moderate LO power levels. (See, Stephen A. Maas, "A GaAs MESFET Balanced Mixer With Very Low Intermodulation," 1987 *IEEE MTT-S Digest*, pp.895–896.). Recently, both "single-balanced" and "double-balanced" FET mixers have been designed for operation over relatively wide frequency ranges (e.g., 2–8 GHz). The characterization of a mixer as "single-balanced" indicates that a balun is coupled to one of the mixer ports (e.g., the LO port), while a "double-balanced" mixer includes baluns at two of the three ports. Baluns advantageously improve isolation between mixer ports, but are often realized as bulky, coiled-wire discrete components. When implemented as integrated circuits, baluns tend to require a large wafer area, thus undesirably increasing cost and circuit dimensions.

The dynamic range of existing FET mixers is a function both of the DC operating characteristics of the FET devices included therein, as well as of the LO drive level. Conventional DC bias techniques, including those involving the application of externally-supplied DC gate voltages, have required substantial LO drive levels in applications requiring significant dynamic range. This has generally required the inclusion of relatively high-power RF amplifiers in the "pumping" circuits used to generate the LO drive signals, often resulting in increased circuit cost and complexity. Hence, there is an interest in reducing the LO drive levels required to be supplied to FET mixers.

OBJECTS OF THE INVENTION

It is therefore an object of the present invention to produce a radio frequency mixer not reliant upon a balun to achieve a high third-order intercept.

It is a further object of the present invention to produce a radio frequency mixer operative over a wide dynamic range at reduced LO drive levels.

It is yet another object of the present invention to produce a radio frequency mixer capable of operation in the absence of DC bias.

SUMMARY OF THIS INVENTION

Briefly, the present invention comprises an unbalanced mixer capable of operation in the absence of DC bias. The mixer includes an input or local oscillator (LO) port for receiving an input signal. A first transistor has a control terminal coupled to the mixer input port, and an output terminal coupled to a first signal port of the mixer. The mixer further includes a resonator circuit, connected between the transistor control and signal terminals, for providing signal isolation between the mixer LO port and the signal port. In a preferred embodiment the resonator circuit comprises an inductive element in parallel with a first intrinsic capacitance of the transistor.

The mixer may also include a diplexer circuit for coupling signal energy of a first frequency between the output terminal to the first signal port, and for coupling signal energy of a second frequency between the output terminal and a second signal port. A series resonant circuit, connected between the input or LO port and the transistor control terminal, may also be provided for amplifying the input signal. In a preferred embodiment the series resonant circuit comprises an input inductive element and an input intrinsic capacitance of the first transistor.

An advantage of this invention is that isolation of the LO port from the other mixer signal pore is achieved without use of a balun.

Another advantage of the present invention is that the mixer is capable of operation in the absence of DC bias.

Yet another advantage of this invention is that the resonator circuit improves the third order intercept point by preventing signal energy from being coupled from the mixer signal ports connected to the transistor output port to the transistor control terminal.

A further advantage of this invention is that operation over a wide dynamic range at reduced LO drive levels is exhibited.

These and other objects and advantages of this invention will no doubt become obvious to those of ordinary sell in the art after having read the following detailed description of the preferred embodiments which are illustrated in the various drawing figures.

IN THE DRAWINGS

DETAILED DESCRIPTION OF THE PREFERRED EMBODIMENTS

Figure 1:
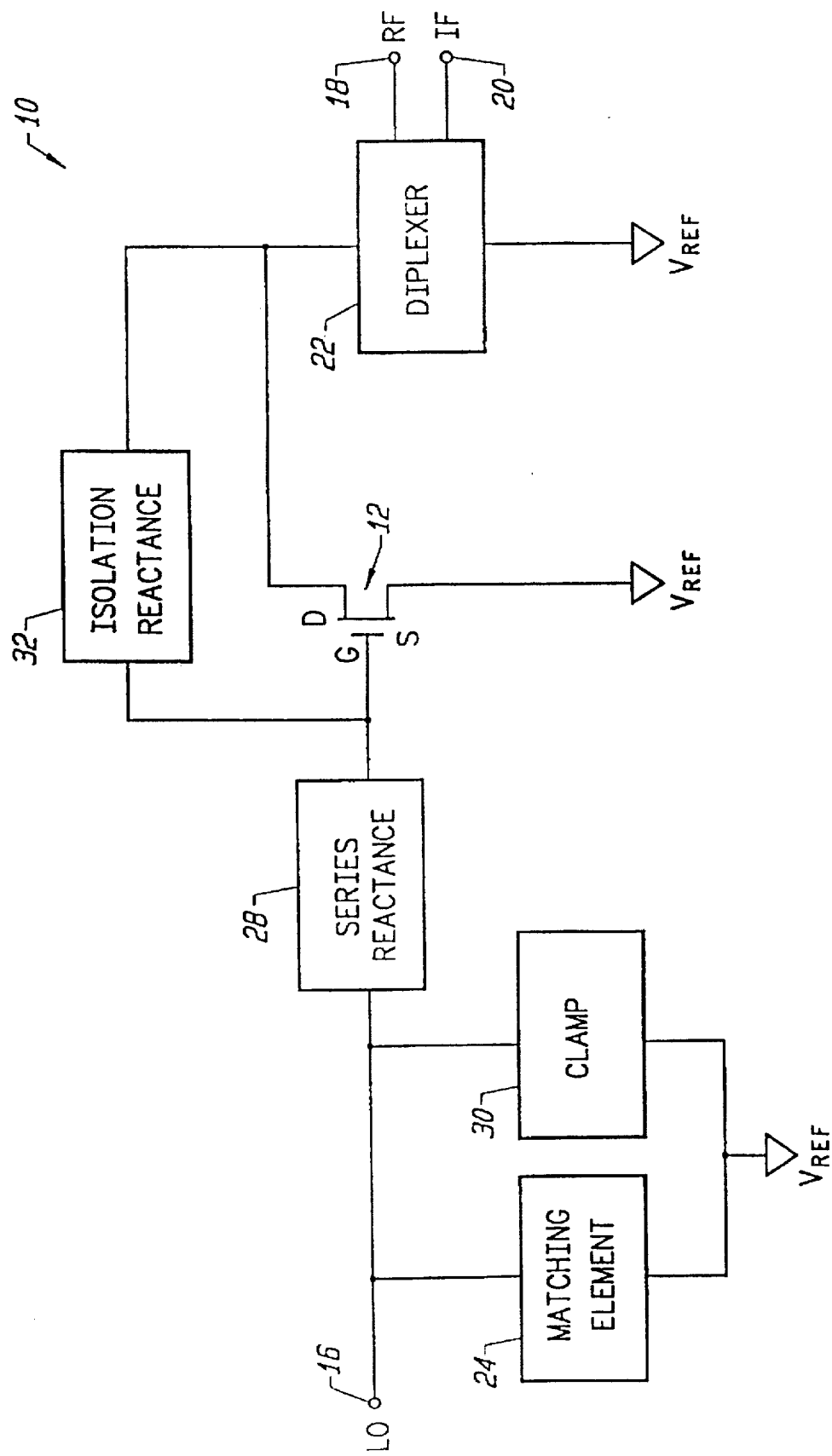
FIG. 1 is a block diagram of preferred embodiment of the unbalanced mixer of the present invention.

FIG. 1 is a block diagram of a preferred embodiment of the unbalanced mixer 10 of the present invention. The mixer 10 includes a transistor 12, which in an exemplary implementation is realized using a field-effect transistor (FET) having a control or gate (G) terminal, as well as drain (D) and source (S) terminals. The mixer 10 includes a local oscillator (LO) input port 16, to which is applied an LO input signal, and further includes radio frequency (RF) and intermediate frequency (IF) signal ports 18 and 20. A diplexer 22, interposed between the drain (D) and the signal ports 18, 20, functions to couple signal energy between these ports and the drain (D). When the mixer 10 is operational as a frequency upconverter, input signals are applied to the LO and IF ports 20 and an output signal coupled from RF signal port 18. During operation as a frequency downconverter, input signals are applied to the LO and RF ports 16 and 18, and output signal tapped from the IF signal port 20.

Since in an exemplary implementation the LO input port 16 receives the LO input signal over a 50 Ω transmission line (not shown), the reactance of a matching element 24 is selected to ensure that the impedance into LO port 16 is also 50 Ω. As is indicated by FIG. 1, the LO input signal is coupled to the FET 12 through a series reactance 28. In accordance with one aspect of the invention, the input LO signal is amplified by a series resonator comprised of: (i) an inductive element within the series reactance 28, and (ii) the intrinsic gate-source capacitance ($C_{gs}$) of the FET 12 The series resonator becomes resonant at the frequency of the LO input signal, and hence reduces the required magnitude of the LO input signal. A clamp circuit 30 prevents negative half-cycles of the amplified LO input signal from causing reverse-breakdown at the transistor gate (G) by clamping the gate voltage to approximately one diode drop below the reference potential $V_{REF}$.

The mixer 10 further includes an isolation reactance 32 connected between the gate (G) and drain (D) of the transistor 12. In accordance with one aspect of the present invention, an inductive component of the isolation reactance 32 and the intrinsic gate-drain capacitance ($C_{gd}$) of the transistor 12 form an "isolation resonator", which effectively decouples the transistor gate (G) from the drain (D) at the RF signal frequency. In particular, the isolation resonator approximates an open circuit at the frequency of the signal energy impressed upon the RF output port 18 by the drain (D) through diplexer 22. In addition, a capacitive component within the isolation reactance 32 provides the requisite low-frequency isolation between the IF signal port 20 and the transistor gate (G). In this way the isolation reactance 32 enables the LO port 16 to be isolated from the RF port 18 without utilization of a balun, thereby enabling efficient realization of the mixer 10 as an integrated circuit 11. The isolation resonator also allows the achievement of a favorable third-order intercept point, since the reverse isolation effected thereby prevents RF and IF signal energy from being coupled to the gate (G) and influencing the conductance of the FET 12.

Figure 2:
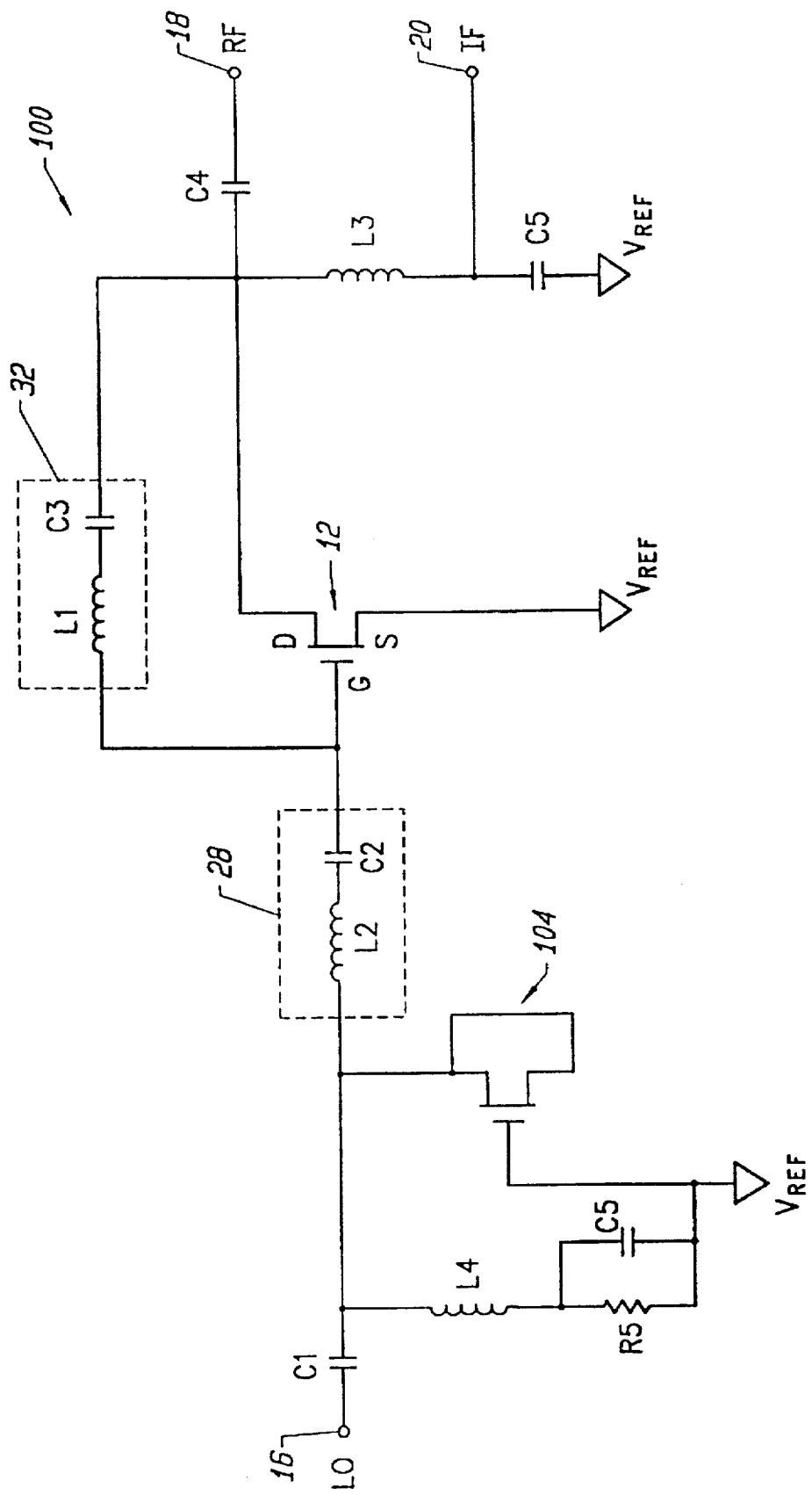
FIG. 2 is a schematic diagram of a preferred embodiment of the unbalanced mixer of this invention.

Referring now to FIG. 2, there is shown a schematic diagram of a preferred embodiment of an unbalanced mixer 100 of the present invention. As is indicated by FIG. 2, the diplexer 22 includes capacitors C4 and C5, and an inductor L3. The inductor L3 serves to prevent higher frequency RF signal energy from being coupled from the transistor drain (D) to the IF signal port 20. In the embodiment of FIG. 2, the isolation reactance 32 is seen to be comprised of an inductor L1 in series with a capacitor C3. The inductor L1, in parallel with the intrinsic capacitance $C_{gd}$ of FET 12, together form an isolation resonator. The value of L1 is selected such that the isolation resonator becomes resonant at the frequency of the RF signal energy coupled to the RF port 18 from the drain (D) of FET 12. Capacitor C3 provides isolation between the relatively low-frequency signals appearing at IF port 20 and the gate (G) of FET 12.

The series reactance 28 at the gate (G) of FET 12 is seen to be comprised of an inductor L2 in series with a capacitor C2 The inductor L2, in series with the intrinsic capacitance $C_{gs}$ of FET 12, forms a series resonator designed to amplify the LO input signal applied at the LO input port 16. This advantageously reduces the magnitude of LO input signal necessary to achieve a given level of RF output power when the mixer is configured as a frequency upconverter. When the mixer is configured as a frequency downconverter, the series resonator enhances efficiency by reducing the LO power level required to achieve a desired IF output power. Since a DC bias current is not supplied to the transistor 12, the channel of transistor 12 is controlled only by the amplified LO input signal being applied to the transistor gate (G). The lack of DC bias is permitted by capacitor C2, which functions to allow the transistor 12 to achieve self-bias.

Capacitor C1 is a DC blocking capacitor, which prevents DC offsets at the LO input port 16 from reaching the transistor gate (G). In addition, the capacitor C1 allows the clamping circuit 30 to attain self-bias.

As mentioned above, reverse breakdown at the gate of FET 12 is prevented by clamp circuit 30. In the embodiment of FIG. 2, clamp circuit 30 is comprised of a diode-connected FET 104. In operation, FET 104 appears as a reverse-biased diode during positive half-cycles of the LO signal applied to LO port 16. When the magnitude of negative half-cycles of the LO signal exceed approximately one diode drop (e.g., 0.7V), the diode-connected transistor 104 becomes forward biased and hence clamps the applied LO input signal level. In an exemplary embodiment it has been found that the matching element 24 should exhibit an inductive reactance in order that the impedance into the LO port 16 be approximately 50 Ω. Accordingly, in the implementation of FIG. 2 the matching element 24 comprises an inductor L4.

Figure 3:
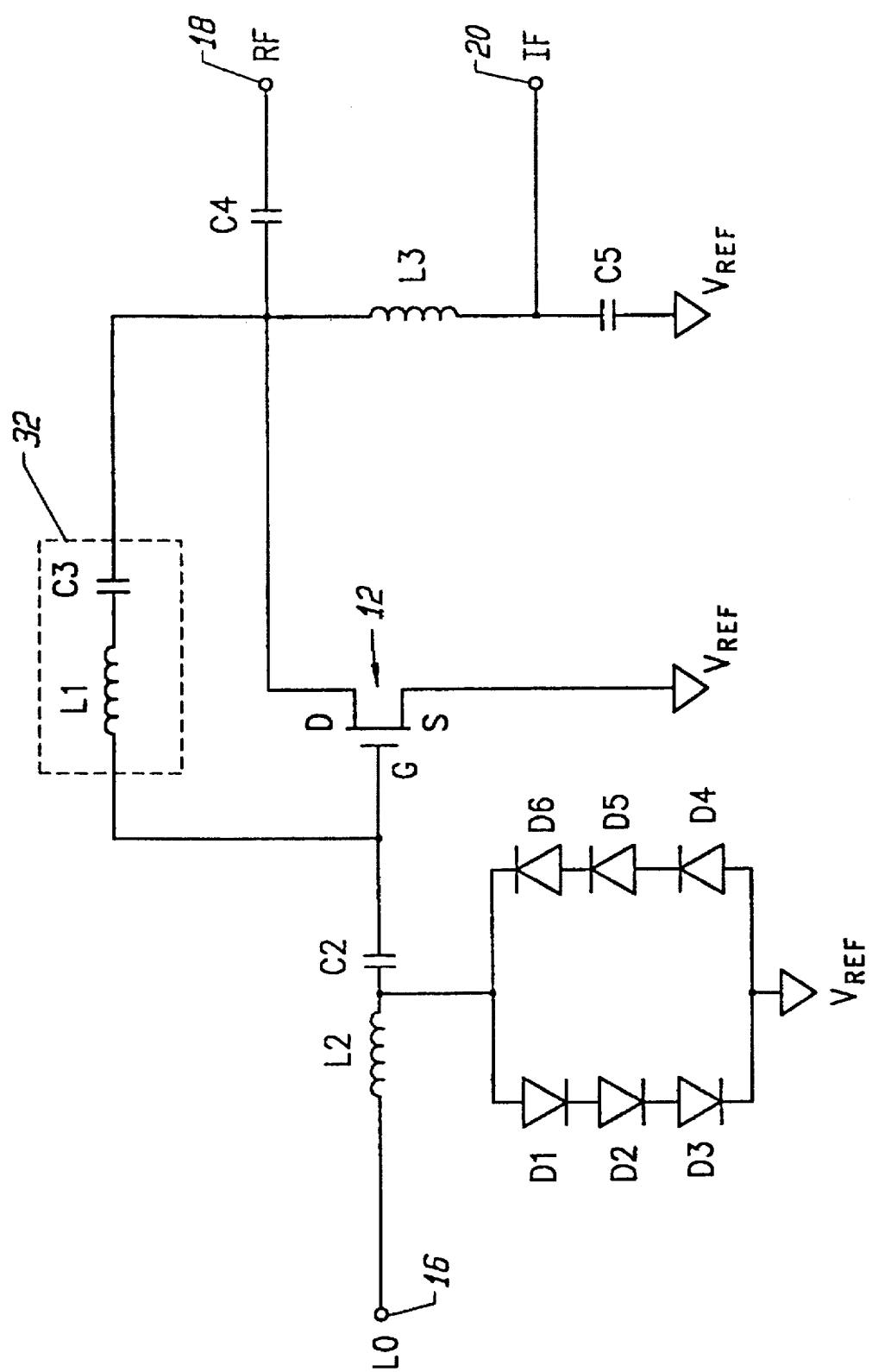
FIG. 3 shows a schematic diagram of an alternate embodiment of an unbalanced mixer in accordance with the present invention.
Figure 4:
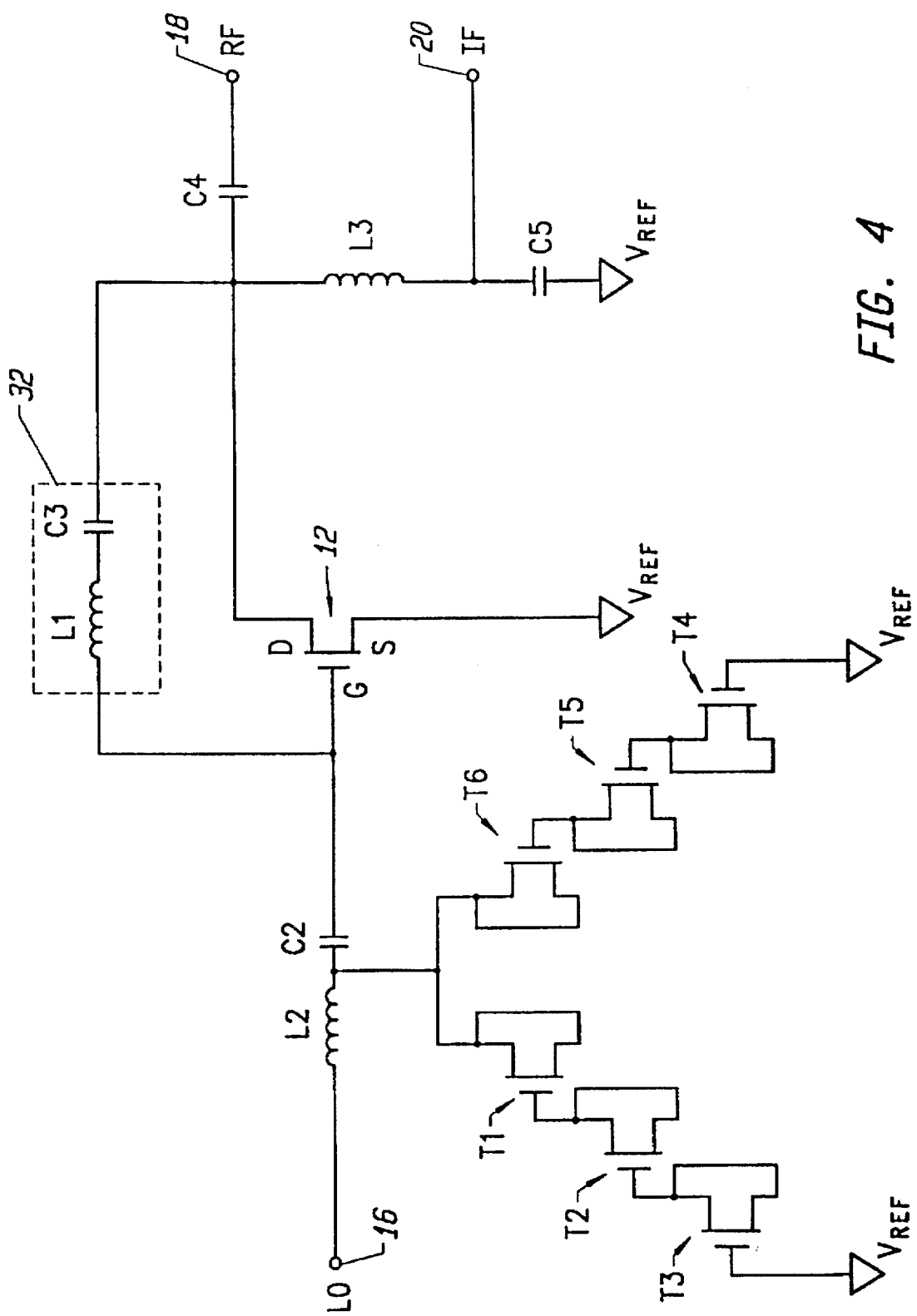
FIG. 4 depicts a specific implementation of the mixer of FIG. 3, in which the diodes comprising a clamp circuit are realized using diode-connected field-effect transistors.

FIG. 3 shows a schematic diagram of an alternate embodiment of an unbalanced mixer in accordance with the present invention. The mixers of FIGS. 2 and 3 are substantially similar, with the exception that the clamp circuit within the mixer of FIG. 3 is realized using parallel chains of series-connected diodes. In particular, the clamp circuit of FIG. 3 includes a first set of series-connected diodes D1–D3, connected in parallel with a second set of series-connected diodes D4–D6. FIG. 4 depicts a specific implementation of the mixer of FIG. 3, in which the diodes D1–D6 are realized using diode-connected field-effect transistors T1–T6.

Although this invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A mixer, comprising:

an input port for receiving local oscillator (LO) input signal;

a first transistor having a gate, a drain, and a source terminal, said gate terminal coupled to said input port, and said drain terminal coupled to a radio frequency (RF) signal port and an intermediate frequency (IF) signal port;

a resonator circuit including an inductive element connected in parallel with a first intrinsic capacitance of said first transistor between said gate terminal and said drain terminal, said resonator circuit providing signal isolation between said LO input port and said RF signal port;

a diplexer circuit for coupling signal energy of a first frequency between said drain terminal and said RF signal port, and for coupling signal energy of a second frequency between said drain terminal and said IF signal port; and a series resonant circuit connected to said LO input terminal, said series resonant circuit including and input inductive element and an input intrinsic capacitance of said first transistor.

2. The mixer of claim 1 further including a reverse-breakdown prevention circuit, connected with said series resonant circuit at said LO input port of said mixer, for preventing said input signal from causing reverse-breakdown at said gate terminal of said first transistor.

3. An unbalanced FET mixer, comprising:

a first FET transistor having a gate, a drain, and a source, said gate being coupled to a first LO port of said mixer;

a diplexer circuit interposed between said drain and said RF and IF ports of said mixer;

a resonator circuit connected between said gate and drain, comprising an inductive element in parallel with a first intrinsic gate-drain capacitance of said first FET transistor, said resonator circuit providing signal isolation between said LO and RF ports of said mixer; and a series resonant circuit connected between said LO port and said gate of said first FET transistor, said series resonant circuit including an input inductive element and a gate-source intrinsic capacitance of said first FET transistor.

4. The mixer of claim 3 wherein said diplexer circuit further includes inductive and capacitive circuit elements for coupling signal energy of a first frequency between said drain and said RF port, and for coupling signal energy of a second frequency between said drain and said IF port.

5. The mixer of claim 3 further including a reverse-breakdown prevention circuit, connected to said LO input port of said mixer, for preventing an input signal applied to said input port from causing reverse-breakdown at said gate of said first FET transistor.

6. An unbalanced FET mixer, comprising:

a local oscillator (LO) port for receiving a local oscillator signal;

a first FET transistor having a gate, a drain and a source, said gate being coupled to said LO port;

a diplexer circuit interposed between said drain and radio frequency (RF) and intermediate frequency (IF) ports of said mixer;

said drain being coupled through said diplexer circuit to said RF and IF ports of said mixer;

a resonator circuit including an inductive element connected with a drain-gate capacitance of said transistor between said gate and drain, said resonator circuit providing signal isolation between said RF and LO ports of said mixer; and a series resonant circuit connected between sail LO port and said gate of said FET transistor, said series resonant circuit being resonant at a frequency of said local oscillator signal.

7. A mixer comprising:

an input port for receiving local oscillator CLO) input signal;

a first FET transistor having a gate, a drain, and a source terminal, said gate terminal coupled to said input port, and said drain terminal coupled to a radio frequency (RF) signal port and an intermediate frequency (IF) signal port;

a resonator circuit including a series combination of an inductor connected in series with a blocking capacitor and said combination connected in parallel with a first intrinsic capacitance of said first transistor between said gate terminal and said drain terminal, said blocking capacitor providing isolation between signals appearing at said IF port and said gate terminal, said resonator circuit providing signal isolation between said LO input port and said RF signal port;

a diplexer circuit for coupling signal energy of a first frequency between said drain terminal and said RF signal port, and for coupling signal energy of a second frequency between said drain terminal and said IF signal port;

a series resonant circuit connected to said LO input terminal, said series resonant circuit including an input inductive element and an input intrinsic capacitance of said first transistor; and a reverse-breakdown prevention circuit, connected to said LO input port of said mixer, for preventing said input signal from causing reverse-breakdown at said LO input terminal of said first transistor.

\* \* \* \* \*